United States Patent [19]
Onose et al.

[11] Patent Number: 5,652,467
[45] Date of Patent: Jul. 29, 1997

[54] SEMICONDUCTOR DEVICE AND PACKAGE STRUCTURE THEREFORE AND POWER INVERTER HAVING SEMICONDUCTOR DEVICE

[75] Inventors: Hidekatsu Onose, Hitachi; Shuroku Sakurada, Hitachinaka, both of Japan

[73] Assignee: Hitachi, Ltd., Tokyo, Japan

[21] Appl. No.: 507,989

[22] Filed: Jul. 27, 1995

[51] Int. Cl.⁶ .................................................. H01L 23/48
[52] U.S. Cl. .......................... 257/785; 257/147; 257/150; 257/151; 257/152
[58] Field of Search ............................ 257/147, 150–152, 257/785

[56]  References Cited

U.S. PATENT DOCUMENTS

| | | | |
|---|---|---|---|
| 4,374,393 | 2/1983 | Kamahara | 257/678 |
| 4,953,004 | 8/1990 | Almenräder et al. | 257/147 |
| 4,996,586 | 2/1991 | Matsuda et al. | 257/147 |
| 5,198,882 | 3/1993 | Matsuda et al. | 257/147 |

FOREIGN PATENT DOCUMENTS

| | | |
|---|---|---|
| 58-134470 | 8/1983 | Japan . |
| 61-281552 | 12/1986 | Japan . |
| 63-58376 | 11/1988 | Japan . |
| 2-137371 | 5/1990 | Japan . |

*Primary Examiner*—Mahshid D. Saadat
*Assistant Examiner*—T. M. Arroyo
*Attorney, Agent, or Firm*—Antonelli, Terry, Stout & Kraus, LLP

[57]  ABSTRACT

An auxiliary cathode lead is contacted to a cathode buffer electrode which contacts to an unit GTO arranged at the most remote region from a gate pressure contacting portion of a GTO pellet and the push-into effect of the auxiliary cathode current during the turn-off can be remarkably performed. Without inviting bad affects such as the increase in "on" voltage, it is proposed a package structure of a semiconductor which the unit GTO arranged remote from a gate is easily to perform the turn-off. The maximum turn-off current can be heightened, it can easily correspond to the increase in the diameter of the pellet according to the large current of the unit element. Further, a condenser of a snubber circuit as a protection circuit of the unit GTO in a power inverter can be small, and the snubber loss can be lessened.

46 Claims, 11 Drawing Sheets

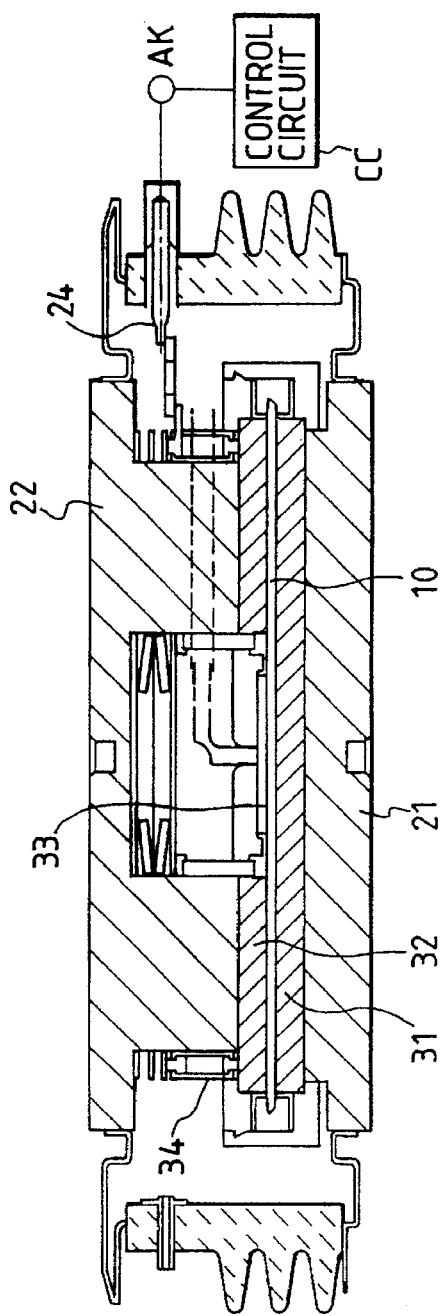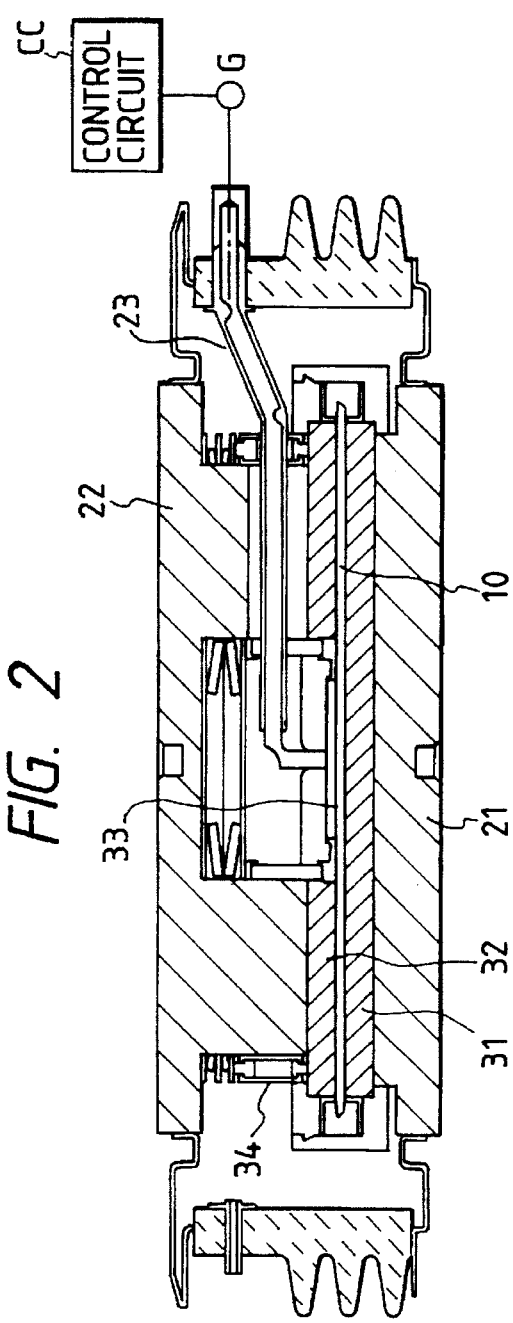

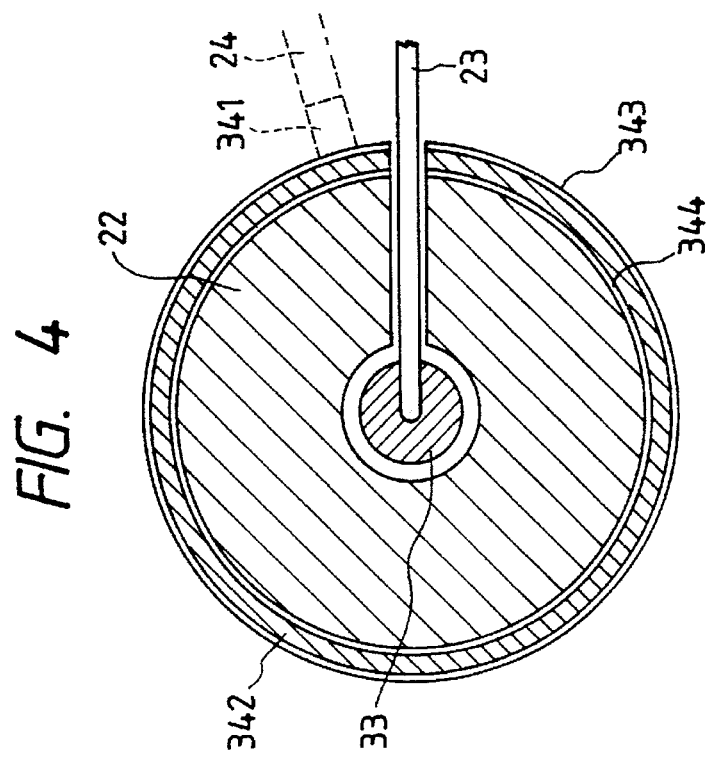
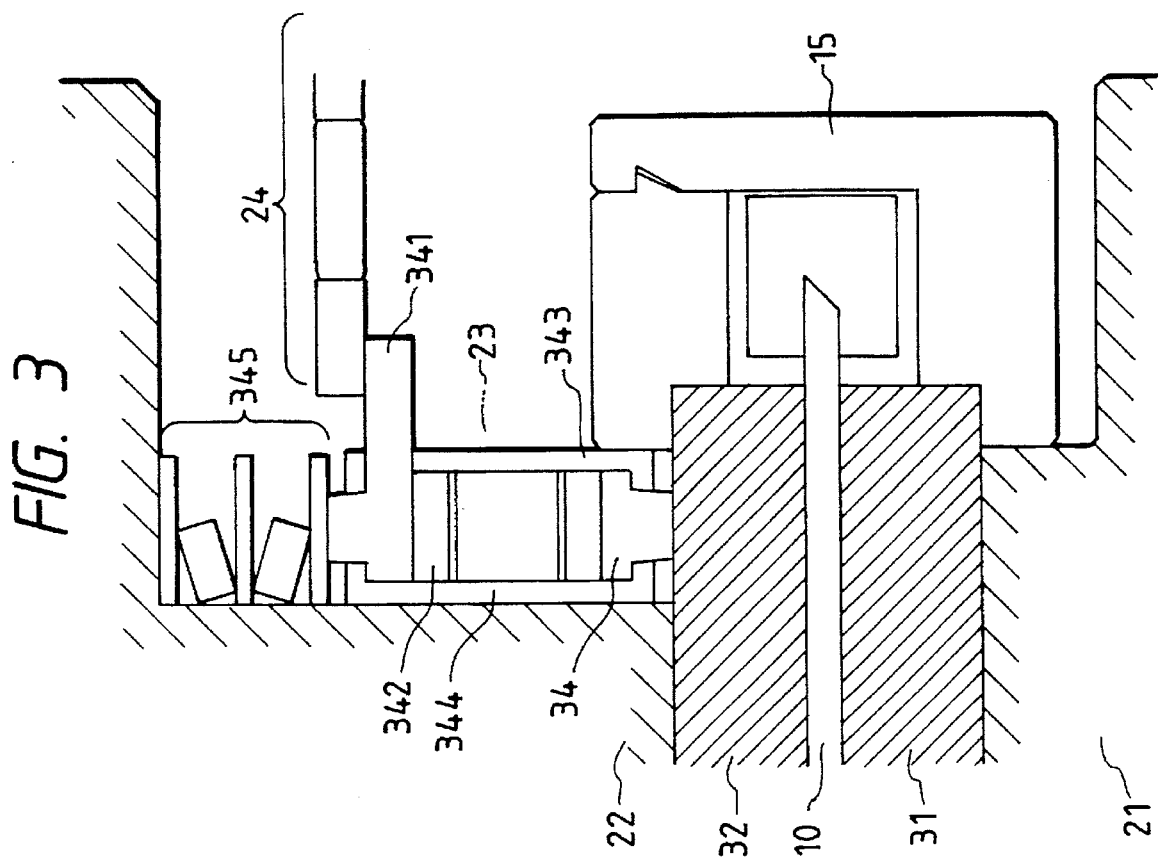

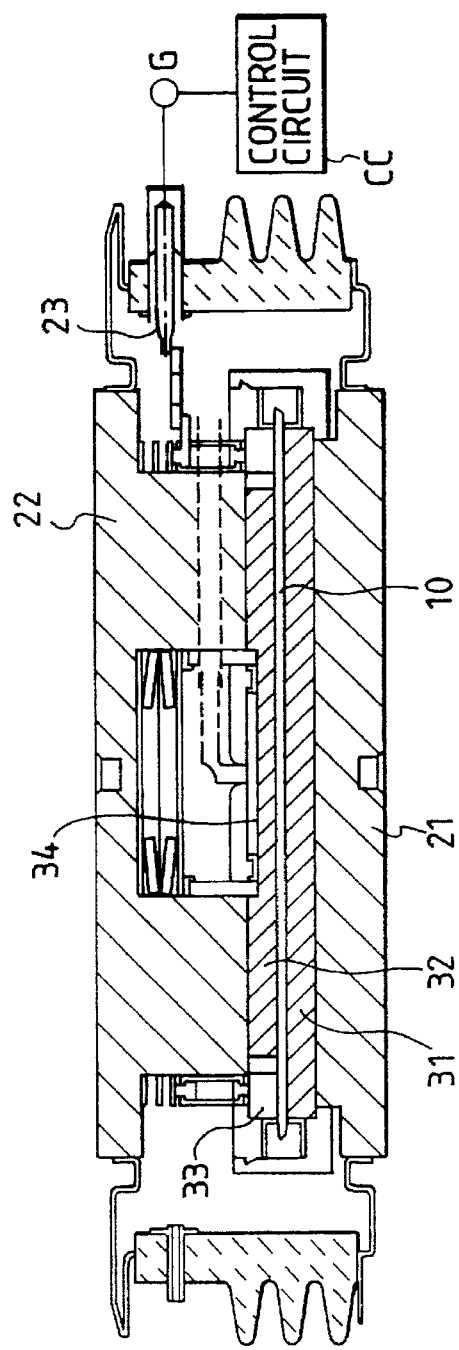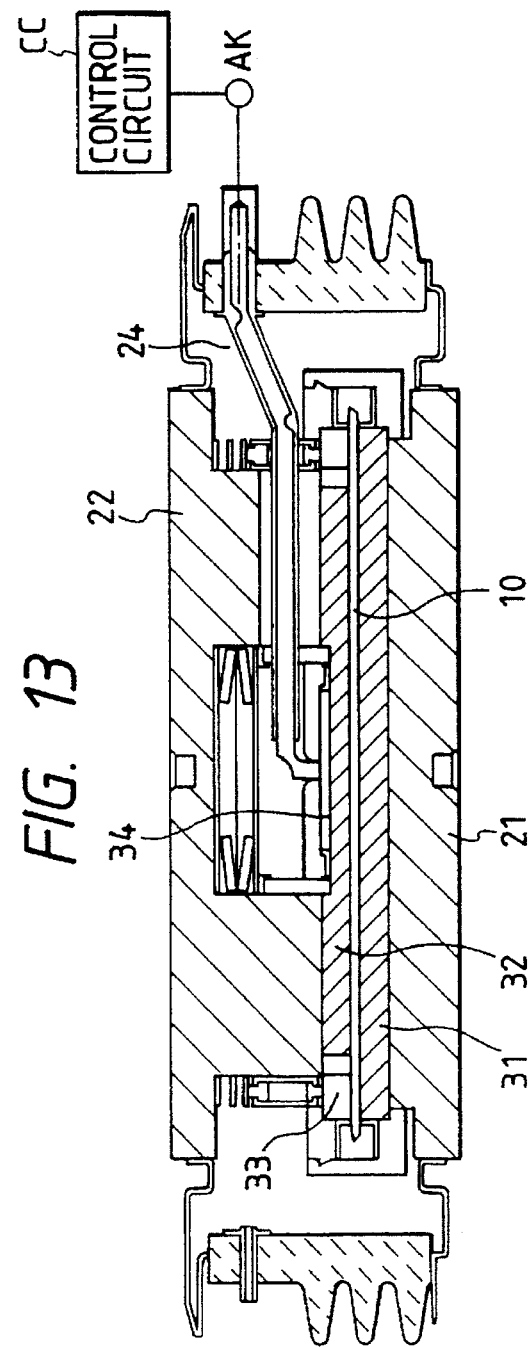

SEMICONDUCTOR DEVICE AND PACKAGE STRUCTURE THEREFORE AND POWER INVERTER HAVING SEMICONDUCTOR DEVICE

BACKGROUND OF THE INVENTION

1. Field of the Invention

The present invention relates to a semiconductor device and a package structure for a semiconductor device and a power inverter having a semiconductor device.

The present invention relates, in particularly, to a semiconductor device which is able to switching control according to the gate current such as a gate turn-off thyristor and a package structure for a semiconductor device such as a gate turn-off thyristor and a power inverter having a semiconductor device such as a gate turn-off thyristor.

2. Prior Art

A gate turn-off thyristor (hereinafter it is given an abbreviated of "GTO") is a current control type semiconductor device which is able to switching control according to the gate current. In this GTO, a high pressure withstanding performance and a large current performance are attempted to make progress and, in accompany with this, a GTO pellet and a package structure for enclosing the GTO pellet are attempted to make scale-up.

FIG. 16 is a cross-sectional view showing a conventional flat type package structure of the semiconductor device of GTO. A GTO pellet 10 is pressed under pressure in contact with a cathode post 22 of a package structure through a cathode buffer 32 and further is pressed under pressure in contact with an anode post 21 through an anode buffer 31.

The gate current for performing the turn-on and the turn-off of GTO passes a gate lead 23 from a control circuit (not shown in figure) and is supplied to the GTO pellet 10 through a gate pressure contacting portion 33. The gate pressure contacting portion 33 is pressed under pressure by the cathode electrode 22 through a belleville spring member 35 etc. and further is pressed under pressure in contact with the GTO pellet 10.

The gate lead 23 and the gate pressure contacting portion 33 have to electrically insulate from the cathode electrode 22 and so that the gate lead 23 and the gate pressure contacting portion 33 are covered by an insulating material member such as teflon etc..

A gate draw-out region or a contact portion of the gate electrode of the GTO pellet 10 isotopically supplies the gate current to each of plural units GTO and in generally is provided on a central portion of the GTO pellet 10 so as to draw out the gate current.

The potential of the gate is based on the cathode electrode 22 as the standard. As a result, as shown in figure, an auxiliary cathode lead 24 is connected to a cathode flange 42 which is electrically connected to the cathode post 22.

The gate current is given the potential at a portion between a gate G and an auxiliary cathode AK according to a gate power supply (not shown in figure) and the electricity is conducted. With the above stated package structure, the turn-on and the turn-off of GTO is performed.

In the above stated conventional package structure for enclosing GTO, when the diameter of the GTO pellet 10 increases in accompany with the large current performance of GTO, there occurs a problem in which the maximum turn-off current during the turn-off operation is lowered and the unit GTO is easily destroyed. This fact will be explained referring to the figures from FIG. 17 to FIG. 19.

FIG. 17 is an operation explanation view showing the current flow during the "on" period state of the semiconductor device of GTO. So as to simplify, it will pay an attention to merely two units GTO comprised of one unit GTO of GTO1 and another unit GTO of GTO2. For simplification of the explanation, the GTO pellet 10 only comprises those two units GTO composed of the unit GTO1 and the unit GTO2.

In this package structure of the semiconductor device of GTO, the unit GTO1 is provided on a region 11 which is most adjacent portion to the gate pressure contacting portion 33, besides the unit GTO2 is provided on a region 12 which is existed at the most remote portion from the gate pressure contacting portion 33.

In this figure, an anode is indicated by A and a cathode is indicated by K. A gate wiring resistance 13 is exists on a surface of the GTO pellet 10, and each of from reference numerals 61 to 65 indicates an electric resistance of the cathode buffer 32, respectively.

Further, in the cathode electrode 22, an electric resistance 51 exists on a region which contacts to the unit GTO1 through the cathode buffer 32, and an electric resistance 52 exists on a region which contacts to the unit GTO2 through the cathode buffer 32.

In the "on" period state of the semiconductor device, in both units GTO1 and GTO2, the "on" current flows between the anode and the cathode. The "on" current 721 of the unit GTO1 and the "on" current 722 of the unit GTO2 appear.

FIG. 18 is an operation explanation view showing a current flow of a turn-off initial period of the semiconductor device of GTO. This figure indicates a state in which the negative bias is added to the auxiliary cathode lead 24.

At the unit GTO1, the turn-off starts and almost current flown from the anode turns to the gate current 731 and flows out toward an outside of the GTO pellet 10 and a part of the current flows toward the cathode.

The gate current 731 drawn out to the gate passes through a gate power supply (not shown in figure) and further passes through from the auxiliary cathode lead 24 to a cathode flange resistance 81. This gate current 731 turns to the auxiliary cathode current 724 and flows toward the cathode.

Besides, in the unit GTO2, because of the potential grade according to the wiring resistance 13 of the gate, the draw-out gate current 732 is little. Almost current turns to the current of the anode A—the cathode K interval current 722 and only flows toward the cathode.

FIG. 19 is an operation explanation view showing the current flow at a state of the semiconductor device of GTO in which the time goes forward. From the unit GTO2 the draw-out of the gate current 732 becomes large. However, the anode A—the cathode K interval of GTO presents the "on" state and the gate current 732 flows toward the cathode of the unit GTO2.

A part of the gate current 732 passes through the cathode buffer 32 and flows into the unit GTO1 from the cathode and this gate current 732 turns to the gate current 733 of the unit GTO1 and is drawn out to the gate. Accordingly, the cathode current of the unit GTO1 becomes negative at this state.

The gate currents 732 and 733 turn to the auxiliary cathode current 724 through a gate power supply (not shown in figure) and flow into toward the cathode. After that, when the current of the anode A—the cathode K interval current 722 of the unit GTO2 turns off, then the unit GTO as a whole works to turn off.

However, when a diameter of the GTO pellet 10 becomes large, since the gate wiring resistance 13 becomes high, the draw-out of the gate current becomes insufficient. Before the unit GTO2 performs to turn off, the anode current is concentrated in the unit GTO2 and it reaches to destroy of the unit GTO2.

FIG. 20 is a wave-form view of the semiconductor device of GTO in which the structures shown from FIG. 17 to FIG. 19 are readjusted by arranging with the wave forms. Each of the time change of the anode current and the time change of the anode voltage is schematically shown.

A time A in this figure corresponds to the structure shown in FIG. 17 and shows the "on" state. Further, a time B corresponds to the structure shown in FIG. 18 and shows a vicinity of the last phase end of the storage.

Since the unit GTO1 is on the way of the turn-off, however the unit GTO2 is the "on" state, the anode current is concentrated to the unit GTO2 and in the unit GTO as a whole the current continues to flow.

A time A corresponds to the structure shown in FIG. 19 and shows a vicinity of the finish phase of the fall. The unit GTO1 presents the "off" state and the unit GTO2 is on the way of the "off" state. As a result, in the unit GTO as a whole the anode current abruptly decreases.

However, since the unit GTO2 is not completely turn off and the fall is not completely performed, some what fall-in of the current (the small value of the anode current during the fall finish) may be seen but the fall is not completely performed. After that, the anode current raises at a predetermined voltage raise rate.

When the unit GTO2 presents the "off" state, after a lapse of a tail period, by having a wave-form shown in a dot line in this figure it reaches to the "off" state.

However, when the current fall-in at the fall finish time is insufficient, since the "off" state of the unit GTO2 is incomplete, it exceeds the maximum turn-off current of the unit GTO and reaches to destroy of the unit GTO. Then the anode voltage abruptly decreases and further the anode current raises.

As stated in the above, the destroy of the unit GTO causes by a fact in which the unit GTO region remote from the gate pressure contacting portion 33 hardly to present the "off" state by the existence of the gate wiring resistance 13 of the gate.

As disclosed in Japanese patent laid-open publication No. Hei 2-137,371, it has proposed that in response to the distance from a gate pressure contacting portion a life time of each of the unit GTO regions is shorten and easily perform to turn off.

However, in the above stated case, it has a problem that an affect of the time life adjustment appears at the "on" state and a current balance between each of the unit GTO regions at the "on" state becomes wrong. To put it concretely, it is considered that the "on" voltage of a whole GTO pellet increases in comparison with no life time adjustment, for example.

Besides, in Japanese patent publication No. Sho 63-58, 376, a gate pressure contacting portion is not arranged at a central portion of a GTO pellet but it is arranged at an intermediate portion between the central portion of the GTO pellet and an outer periphery portion of the GTO pellet, namely an intermediate ring gate system package structure is proposed.

However, in the above case, the package structure for enclosing GTO becomes complicated one, there is an anxious that it is difficult to uniformly press under pressure the unit GTO as a whole. Further, since it exists inevitably the unit GTO region which is most remote portion from the gate pressure contacting portion, thereby a problem is not still solved, such a problem is that the turn-off of GTO hardly is performed at this unit GTO region.

SUMMARY OF THE INVENTION

An object of the present invention is to provide a semiconductor device and a package structure for a semiconductor device and a power inverter having a semiconductor device wherein the semiconductor device can be attained a large maximum turn-off current during the turn-off period.

Another object of the present invention is to provide a semiconductor device and a package structure for a semiconductor device and a power inverter having a semiconductor device wherein the unbalance of the "on" current in the interior portion of the semiconductor device during the "on" state does not occur.

A further object of the present invention is to provide a semiconductor device and a package structure for a semiconductor device and a power inverter having a semiconductor device wherein the increase of the "on" voltage of the semiconductor device does not occur.

A further object of the present invention is to provide a semiconductor device and a package structure for a semiconductor device and a power inverter having a semiconductor device wherein a condenser provided on the snubber circuit being the protection circuit of semiconductor device can be performed small, the effect in which the loss in the snubber circuit can be lessened can be obtained.

In a semiconductor device according to the present invention, a semiconductor pellet, in which a first main electrode, a second main electrode and a control electrode for controlling a current flown between the first main electrode and the second main electrode are formed, is received in a package structure.

In the package structure, an electrode plate is contacted to the main electrode of the semiconductor pellet and an outside electrode is pressed under pressure in contact with the electrode plate. Further, a control electrode lead contacted to the control electrode of the semiconductor pellet is provided and an auxiliary electrode lead contacted to the electrode plate is provided.

Further, the semiconductor device according to the present invention, the auxiliary electrode lead is contacted to arrange adjacently on the electrode plate to the most remote region from a contact portion between the control electrode lead and the control electrode of the semiconductor pellet.

According to the present invention, a control electrode lead and an auxiliary electrode lead are connected to a control circuit and, through a signal from the control circuit, a main current flown in a first main electrode and a second main electrode of a semiconductor pellet is controlled.

In this case, since the auxiliary electrode lead is contacted to an electrode plate which contacts to the semiconductor pellet (in other words, the auxiliary electrode lead is contacted at a vicinity of the semiconductor pellet in the package structure), the electric resistance between the auxiliary electrode lead and the first main electrode of the semiconductor pellet can be lessened.

As a result, during the turn-off the current drawn-out from the control electrode of the semiconductor pellet passes through the auxiliary electrode lead and through the electrode plate and it can flow again into the semiconductor pellet from the first main electrode.

Herein, since the current flown into the semiconductor pellet through the auxiliary electrode lead flows into the reverse direction against the main current which flows into the first main electrode and the second main electrode, the turn-off of the semiconductor device is promoted. Accordingly, the maximum turn-off current of the semiconductor device can be improved.

Further, since the auxiliary electrode lead is contacted to the electrode plate at the most remote region from the contact portion between the control electrode lead and the control electrode of the semiconductor pellet.

As stated in the above from the auxiliary electrode lead the current flows into the element region which is remote from the contact portion between the control electrode lead and the control electrode of the semiconductor pellet.

By the flowing of this current, the turn-off is promoted at the unit GTO region in which in the conventional technique it is difficult to perform the turn-off under the affect of the electric resistance between the control electrode lead and the control electrode of the semiconductor pellet. Accordingly, the maximum turn-off current of the semiconductor device can be improved.

BRIEF DESCRIPTION OF DRAWINGS

FIG. 1 is a longitudinal cross-sectional view along to a draw-out portion of an auxiliary cathode lead of a package structure of a semiconductor device of a first embodiment according to the present invention;

FIG. 2 is a longitudinal cross-sectional view along to a draw-out portion of a gate lead of the package structure of the semiconductor device of the first embodiment according to the present invention;

FIG. 3 is a partially and enlarged longitudinal cross-sectional view of the package structure of the semiconductor device for explaining the first embodiment according to the present invention;

FIG. 4 is a partially and enlarged horizontal cross-sectional view of the package structure of the semiconductor device for explaining the first embodiment according to the present invention;

FIG. 12 is a longitudinal cross-sectional view along to a draw-out portion of a gate lead of a package structure of a semiconductor device of a fifth embodiment according to the present invention;

FIG. 13 is a longitudinal cross-sectional view along to a draw-out portion of an auxiliary cathode lead of the package structure of the semiconductor device of the fifth embodiment according to the present invention;

DESCRIPTION OF THE INVENTION

Figure 5:
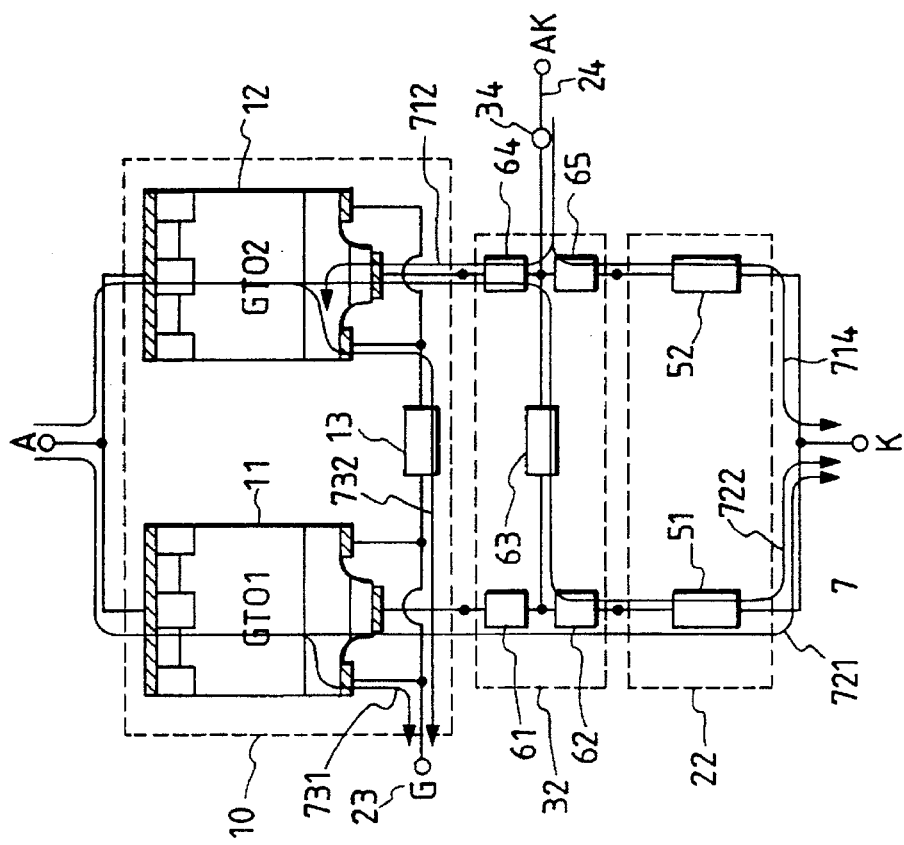
FIG. 5 is an explanatory view of the package structure of the semiconductor device for explaining the operation of the first embodiment according to the present invention.

Hereinafter, various embodiments of a semiconductor device, a package structure of a semiconductor and a power inverter according to the present invention will be explained referring to the drawings.

Embodiment 1:

FIG. 1 is a longitudinal cross-sectional view along to a draw-out portion of an auxiliary cathode lead of a package structure of a semiconductor device of a first embodiment according to the present invention and FIG. 2 is a longitudinal cross-sectional view along to a draw-out portion of a gate lead of the package structure of the semiconductor device of the first embodiment according to the present invention.

This first embodiment according to the present invention shows a package structure of a semiconductor device of GTO and is the most general one and exemplifies a center gate system package structure. In this center gate system package structure, a gate pressure contacting portion is provided at a central portion of a GTO pellet.

The package structure of the semiconductor device of GTO in the first embodiment according to the present invention comprises a GTO pellet 10, an anode post 21 (or outside anode electrode) of the package structure, a cathode post 22 (or outside cathode electrode) of the package structure and a gate lead 23 as a control electrode lead, and an auxiliary cathode lead 24 as an auxiliary electrode lead.

The above package structure of the semiconductor device comprises further an anode buffer 31 comprised of metal of molybdenum etc., a cathode buffer 32 as an electrode plate comprised of metal of molybdenum etc., a gate pressure contacting portion 33, and an auxiliary cathode electrode 34 for contacting the auxiliary cathode lead 24 to the cathode buffer electrode 32.

In FIG. 1, the gate lead 23 is shown by a dot line for reference. A gap for arranging the gate pressure contacting portion 33 is provided at a central portion in the cathode buffer 32 and a dent portion is provided at the cathode post electrode 22.

The auxiliary cathode electrode 34 is arranged so as to contact to an outer periphery portion of the cathode buffer 32 which is most remote portion from the gate pressure contacting portion 33. A gate G and an auxiliary cathode AK are connected to a control circuit CC.

FIG. 3 is a partially and enlarged longitudinal cross-sectional view of the package structure of the semiconductor device for explaining the first embodiment according to the present invention and further showing a method for contacting the auxiliary cathode lead to the cathode buffer.

The auxiliary cathode lead 24 fixedly contacts to an auxiliary cathode draw-out portion 341 which comprises a metal of a copper etc.. The auxiliary cathode draw-out portions 341 are laminated to an auxiliary cathode buffer 342 comprised of a metal of molybdenum etc. and the auxiliary cathode electrode 34 through the auxiliary cathode buffer 342 comprised of a metal of molybdenum etc. and are contacted to the outer periphery portion of the cathode buffer 32.

Besides, the auxiliary cathode draw-out portion 341 is contacted to the cathode post 22 through an auxiliary belleville spring member 345 which comprises a washer and a belleville spring member.

As a result, by pressing under pressure the cathode post 22, through the auxiliary belleville spring member 345, the auxiliary cathode drawn-out portion 341, the auxiliary cathode buffer 342, the auxiliary cathode electrode 34 are pressed under pressure in turn and are pressed under pressure in contact with the cathode buffer 32.

So as to prevent the auxiliary cathode current from directly flowing into the cathode post 22 without passing through the cathode buffer 32, the auxiliary cathode draw-out portion 341, the auxiliary cathode buffer 342, the auxiliary cathode electrode 34 are covered in a lump by insulating material members 343 and 344 comprised of teflon etc. and are fixed.

In this case, the current flowing into the cathode post 22 from a side of the auxiliary belleville spring member 345 can be practically neglected because the auxiliary belleville spring member 345 has extremely high resistance due to a line contact.

In a case of the contact method having the low resistance, it is necessary to intervene an insulating material member such as teflon, mica at the cathode post 22.

The contact position relationship between the auxiliary cathode electrode 34 and the GTO pellet 10 is important. It is desirable to arrange concentrically the auxiliary cathode electrode 34 and the GTO pellet 10.

So as to attain the above contact positional relationship, in this first embodiment according to the present invention, the teflon 15, which integrally fixes the anode buffer 31, the GTO pellet 10 and the cathode buffer 32, is substantially contacted to the insulating material member 343 for covering the auxiliary cathode electrode 34 etc., thereby the position of the auxiliary cathode electrode 34 is determined.

Further, the auxiliary cathode lead 24 has a part of a flexible portion comprising of a winding of a metal fine wire and can easily correspond the change in position.

FIG. 4 is a partially and horizontally cross-sectional view showing the package structure of the semiconductor device for explaining a relationship between the auxiliary cathode buffer 342 and the gate lead 23 according to the present invention.

In this first embodiment according to the present invention, a notch portion is provided on a part of the auxiliary cathode buffer 342 and the gate lead 23 is arranged at the above notch portion. The auxiliary cathode buffer 342 and the auxiliary cathode electrode 34 (not shown in this figure) have to form a ring shape so as to equally have an affect on the unit GTO surrounding the GTO pellet 10 according to the auxiliary cathode current.

In this figure, the auxiliary cathode draw-out portion 341 and the auxiliary cathode lead 24 are shown using dot lines for reference. Further, both the auxiliary cathode draw-out portion 341 and the auxiliary cathode lead 24 are arranged with a slight angle against the gate lead 23.

The above angle is an optional, such an angle is selected from, for example, 45°, 60°, 90°, 120° or 180°. However, taking into the consideration of the inductance of the auxiliary cathode current and the gate current, it is preferable to make a minimum interval between the gate lead 23 and the auxiliary cathode lead 24 for maintaining the insulation property, as a result the angle of both is preferable to have small such as 20° etc.

Hereinafter, the operation in this first embodiment according to the present invention will be explained referring to from FIG. 5 to FIG. 8.

FIG. 5 is an explanatory view showing the current flow during the "on" state in this package structure of the semiconductor device of GTO. So as simplify the explanation, it pays an attention to an unit GTO1, which is the unit GTO 11 most adjacent portion to the gate pressure contacting portion 33, and an unit GTO2, which is the unit GTO 12 most remote portion from the gate pressure contacting portion 33.

In the above first embodiment according to the present invention, the GTO pellet 10 comprises above two members which are the units GTO1 and GTO2. In this figure, the anode and is indicated by A and the cathode is indicated by K.

The unit GTO1 of the GTO pellet 10 comprises a cathode electrode UK as a first main electrode, an anode electrode UA as a second main electrode, and a control electrode UG for controlling the current which flows between the cathode electrode UK (the first main electrode) and the anode electrode UA (the second main electrode).

Further, the unit GTO2 of the GTO pellet 10 comprises a cathode electrode UK as a first main electrode, an anode electrode UA as a second main electrode, and a control electrode UG for controlling the current which flows between the cathode electrode UK (the first main electrode) and the anode electrode UA (the second main electrode).

The package structure of the semiconductor device of GTO comprises a gate wiring resistance on a surface of the GTO pellet 10 and electric resistances 61–64 of the cathode buffer 32.

The cathode buffer 32 comprises a resistance 51 of a region which contacts to the unit GTO1 through the cathode buffer 32 and a resistance 52 of a region which contacts to the unit GTO2 through the cathode buffer 32. The auxiliary cathode lead 24 is contacted to the cathode buffer 32 through the auxiliary cathode electrode 34.

Under the "on" state of the semiconductor device, the current flows both units GTO1 and GTO2 between the anode and the cathode. The "on" current 721 of the unit GTO1 and the "on" current 722 of the unit GTO2 appear in the semiconductor device.

The "on" current 721 passes the resistance 51 of the cathode post 22 at a vicinity of the gate pressure contacting portion 33 through the small resistances 61 and 62 of the cathode post 22 at the vicinity of the gate pressure contacting portion 33 and flows into the cathode.

Further, the "on" current 722 passes the resistance 52 of the cathode post 22 remote from the gate pressure contacting portion 33 through the small resistances 64 and 65 of the cathode post 22 remote from the gate pressure contacting portion 33 and flows into the cathode.

Figure 6:
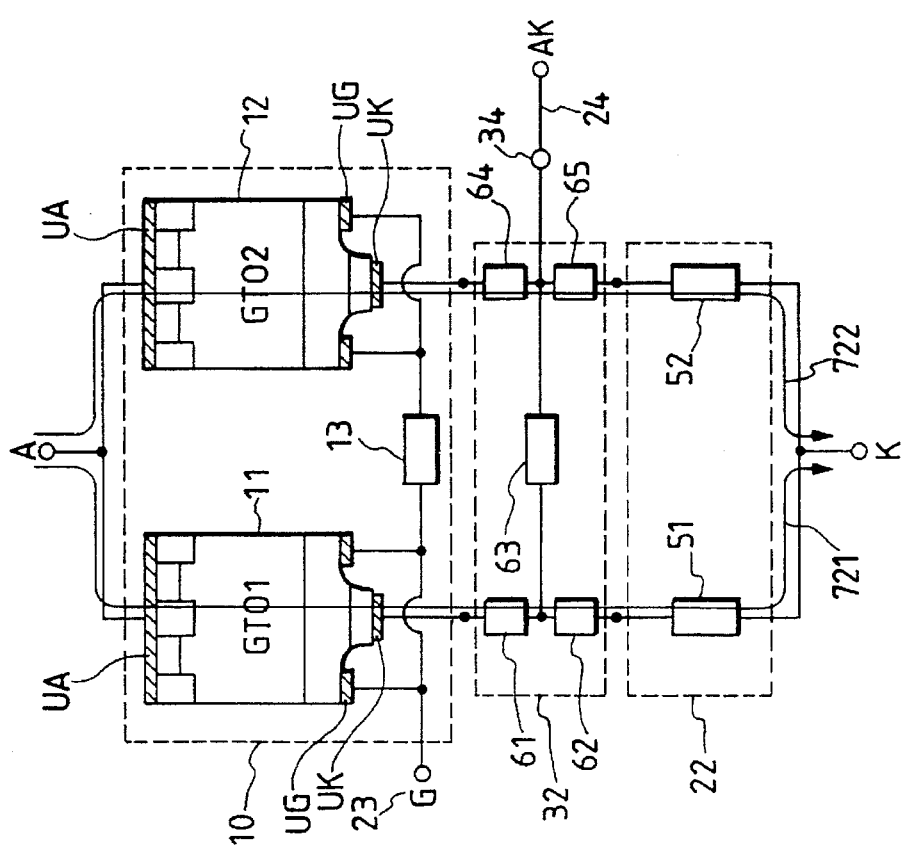
FIG. 6 is an explanatory view of the package structure of the semiconductor device for explaining the operation of the first embodiment according to the present invention.

FIG. 6 is an explanatory view of the package structure of the semiconductor device for explaining the operation of the first embodiment according to the present invention in which the current flow is shown during the turn-off initial period. It shows that a negative bias is added to the gate lead 23 against the auxiliary cathode lead 24.

In the unit GTO1 the turn-off operation starts, almost current flown from the anode turns to a gate current 731 and the remainder of the current passes the resistance 51 of the cathode post 22 through the resistances 61 and 62 of the cathode buffer 32 and flows into the cathode.

The current drawn out to the gate passes a gate power supply (not shown in figure) and from the auxiliary cathode lead 24 to the cathode buffer 32 turns to an auxiliary cathode current 712 and flows into.

Besides, in the unit GTO2, because of the potential gradient due to the gate wiring resistance of the gate, almost current turns to the current 722 between the anode A and the cathode K and tries to flow into the cathode buffer 32.

However, the component of the auxiliary cathode current 712 which is a part of the flown auxiliary cathode current 712 passes the cathode buffer resistance 64 and flows into the cathode of the unit GTO2 and further tries to flow out as the gate current from the cathode of the unit GTO2. This shows a push-into effect of the auxiliary cathode current 712.

As a result, the gate current 732 of the unit GTO2 increases and the current 722 between the anode A and the cathode K decreases. An effect similar to the case in which the gate wiring resistance becomes small is influenced.

Namely, by the operation of the auxiliary cathode current 712, even in the unit GTO2 the turn-off is accelerated and the turn-off of the current between the anode A and the cathode K is promoted.

Further, the current 722 between the anode A and the cathode K of the unit GTO2 flown into the cathode buffer 32 does not flow into the cathode buffer 32 as it is, but by the push-into effect of the auxiliary cathode current 712 the current is pushed out a side of the gate pressure contacting portion 33 in the cathode buffer 32.

The current passes the resistance 51 of the cathode buffer 32 through the surface resistance 63 of the cathode buffer 32 and the resistance 62 of the cathode buffer 32 and flows into the cathode. The remainder of the auxiliary cathode current 714 passes the resistance 52 of the cathode post 22 through the small resistance 65 and flows into the cathode.

Figure 7:
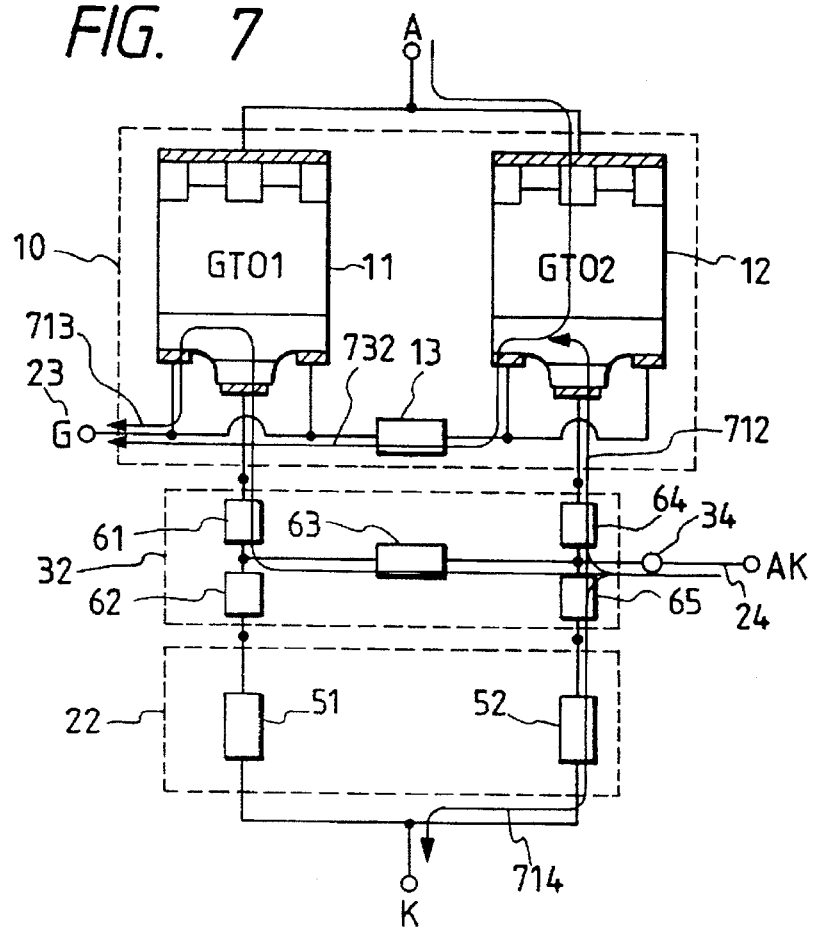
FIG. 7 is an explanatory view of the package structure of the semiconductor device for explaining the operation of the first embodiment according to the present invention.

FIG. 7 is an explanatory view of the package structure of the semiconductor device for explaining the operation of the first embodiment according to the present invention in which the current flow is shown at the advanced time state.

Even in the unit GTO2, by the push-into auxiliary cathode current 712, the current between the anode A and the cathode K is turn off. The current entered from the anode and the auxiliary cathode current 712 turns to the gate current 732 and drawn out to the gate. In this case, the cathode current of the unit GTO2 is negative.

Further, a component 713, which is a part of the auxiliary cathode current 712, flows into the cathode of the unit GTO1 through from the surface resistance 63 of the cathode buffer 32 to the resistance 61 of the cathode buffer position at a vicinity of the gate pressure contacting portion 33 and turns to the gate current. In this case, the cathode current of the unit GTO1 is negative.

The currents 713 and 732 drawn out to the gate pass a gate power supply (not shown in figure) and from the auxiliary cathode lead 24 to the cathode buffer 32 turns to the auxiliary cathode current 714 and flows into.

The remainder of the auxiliary cathode current 714 passes the resistance 52 of the cathode post 22 through the small resistance 65 of the cathode buffer 32 and flows into the cathode. Further, when the time is lapsed, both units GTO1 and GTO2 completely perform to turn off and both units GTO1 and GTO2 do not reach the destroy state of the unit GTO1 or the unit GTO2.

Figure 8:
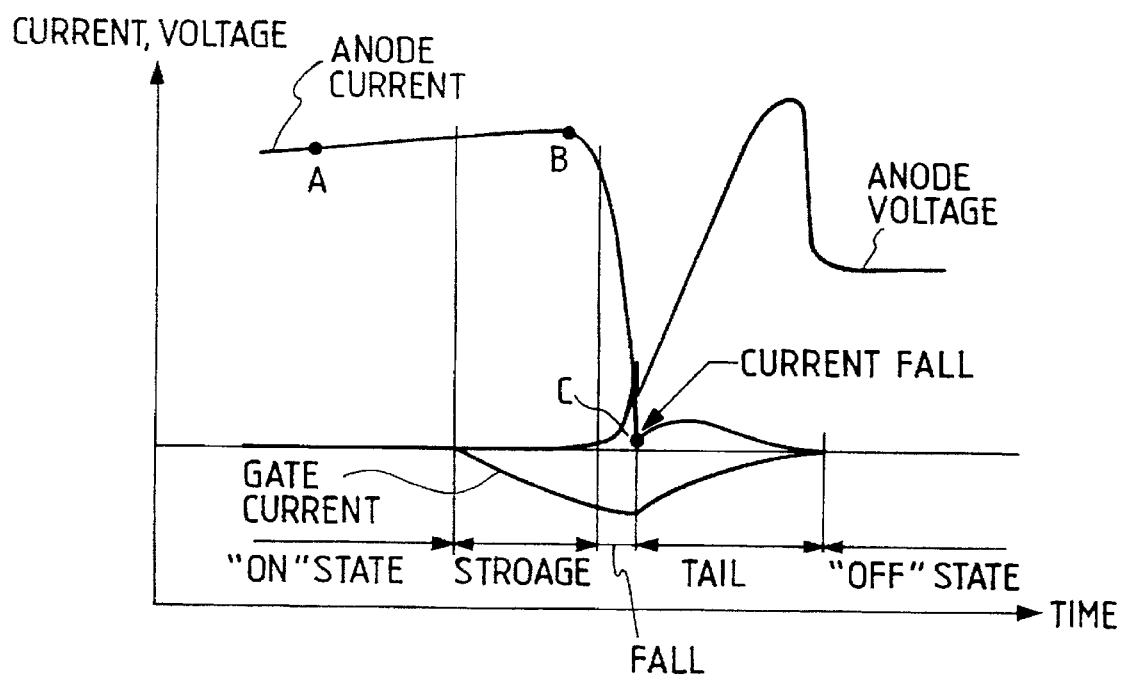
FIG. 8 is a turn-off wave-form view of the package structure of the semiconductor device of GTO for explaining the first embodiment according to the present invention.

FIG. 8 is a turn-off wave form view in which from FIG. 5 to FIG. 7 are arranged with the wave-form and showing a turn-off wave-form schematically expressing the time change of the anode current and the time change of the anode voltage of the unit GTO as a whole.

In this figure, a time A corresponds to the structure shown in FIG. 5 and shows the "on" state. Further, a time B corresponds to the structure shown in FIG. 6 and shows a vicinity of the finish state of a storage.

The anode current remains to be left the flow state, however, since the unit GTO1 and the unit GTO2 start to state the "off" state, the cathode current forming a difference with the gate current reduces. A time C corresponds to the structure shown in FIG. 7 and is a vicinity of the finish of the fall.

Since both units GTO1 and GTO2 are in the course of "off" state, the anode current abruptly reduces and it is sufficient to have the fall down of the current. This is resulted that in both units GTO1 and GTO2 the cathode current becomes negative.

This is an important thing for the improvement of the maximum turn-off current of the GTO pellet 10 as a whole. After that, the anode voltage rises at a predetermined voltage rise rate. After the tail period is lapsed, it becomes the "on" state.

As stated in above, by utilizing the auxiliary cathode current, since even the turn-off of the unit GTO2 most remote from the gate pressure contacting portion 33 is accelerated, the scattering in the surface of the turn-off operation of GTO can be restrained and it never occur to destroy the unit GTO1 or the unit GTO2.

Figure 9:
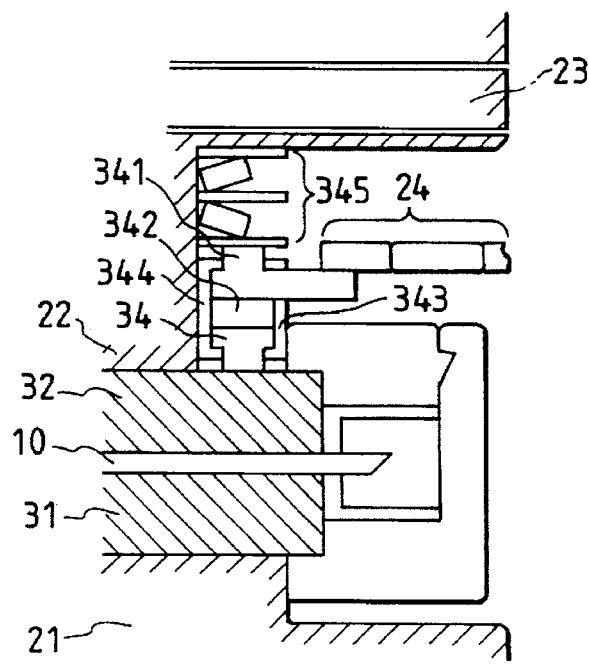
FIG. 9 is a partially and enlarged longitudinal cross-sectional view of a package structure of a semiconductor device for explaining a second embodiment according to the present invention.

Embodiment 2:

FIG. 9 is a partially and enlarged cross-sectional view showing a second embodiment of a package structure of a semiconductor device of GTO according to the present invention.

This second embodiment according to the present invention shows an example of a center gate system package structure. A gate lead is not arranged as shown in the first embodiment according to the present invention in which the gate lead 23 is arranged in the notch portion provided at the part of the auxiliary cathode buffer 344. However an auxiliary cathode buffer 344 is made thin or is removed, thereby a system for directly dawning out from the cathode post 22 is employed.

The auxiliary cathode buffer 344 is arranged at a periphery portion of the cathode buffer 32 similarly to the first embodiment according to the present invention and is pressed under pressure by an auxiliary belleville spring member 345.

In this second embodiment according to the present invention, since the auxiliary cathode current flows into the cathode buffer 32 without through the cathode post 22, the maximum turn-off current of GTO can be improved similarly to the first embodiment according to the present invention.

This second embodiment according to the present invention can adopt to the center gate system and also to other gate systems.

Figure 10:
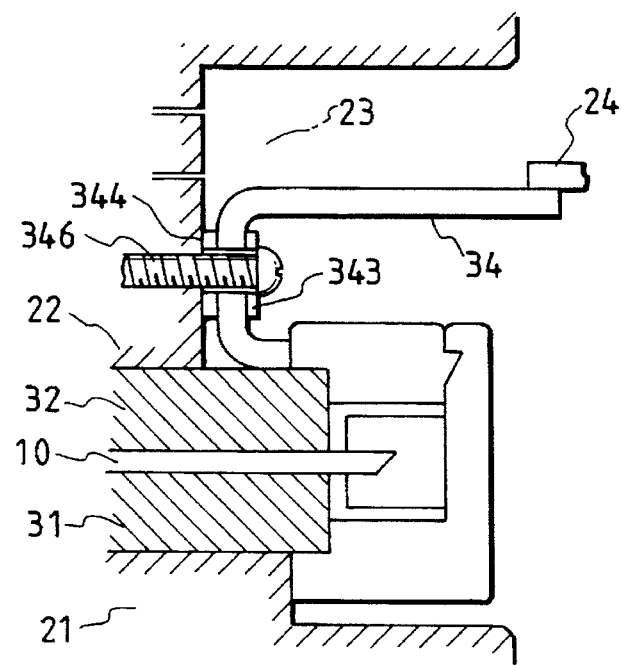
FIG. 10 is a partially and enlarged longitudinal cross-sectional view of a package structure of a semiconductor device for explaining a third embodiment according to the present invention.

Embodiment 3:

FIG. 10 is a partially and enlarged cross-sectional view showing a third embodiment of a package structure of a semiconductor device of GTO according to the present invention.

This third embodiment according to the present invention differs from the second embodiment according to the present invention and a system employed in this third embodiment according to the present invention the auxiliary cathode electrode 34 is directly fixed to the auxiliary cathode lead 24.

Further, in this system the auxiliary cathode electrode 34 is fixed to a side wall of the cathode post 22 through the insulating material member 344, for example, of teflon or mica etc.. As the fixing method, in this third embodiment according to the present invention a screw member 346 is used.

A cross-sectional shape of the auxiliary cathode electrode 34 is formed U shape or J shape and by means of the elastic force according to the bend the cathode post 22 is pressed under pressure in contact with the cathode buffer 32.

Further, so as not flow the auxiliary cathode current through the screw member into the cathode buffer 32 and so as to prevent the auxiliary cathode current from flowing into the cathode post 22, in this third embodiment according to the present invention, the insulating material members 343 such as teflon and mica etc. is provided between the screw members 346 and the auxiliary cathode electrode 34.

The gate lead 23 does not arranged in such a manner in which the through the hole or the notch portion etc. is provided on the auxiliary cathode electrode 34, however the gate lead 23 is separately arranged.

This results in that it is possible to arrange by an arrangement method in which the through-hole or the notch portion etc. is provided on the auxiliary cathode electrode 34, however in a case that the auxiliary cathode electrode 34 is pressed under pressure in contact with the cathode buffer 32 according to the elastic force by the bending shape of the auxiliary cathode electrode 34, the stress non-uniform portion exists at a part on which the through-hole or the notch portion etc. is provided.

As a result, the contact between the auxiliary cathode electrode 34 and the cathode buffer 32 becomes non-uniform and at partially there may cause a danger that the auxiliary cathode current does not sufficiently flow into.

Accordingly, preferably it is desirable to not provide the through-hall or the cut-off portion on the auxiliary cathode electrode 34 having the bending shape.

In this third embodiment according to the present invention, the maximum turn-off current can be improved similarly to the first embodiment according to the present invention. Further, in this third embodiment according to the present invention, similarly to the second embodiment according to the present invention, the various gate systems can be adopted.

Figure 11:
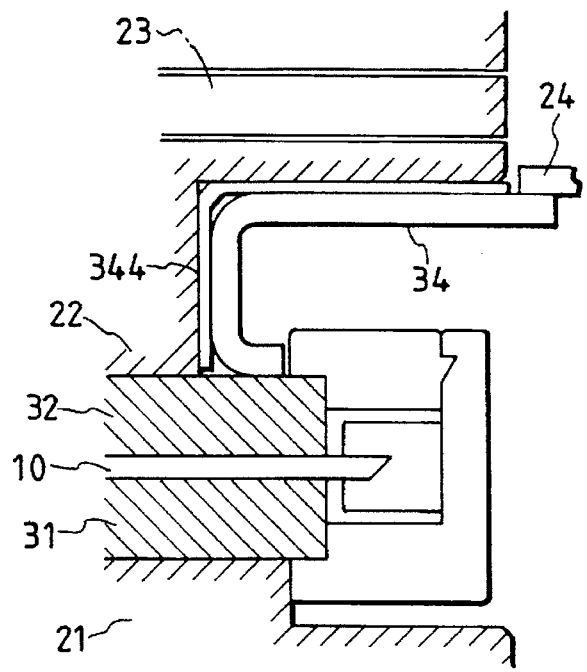
FIG. 11 is a partially and enlarged longitudinal cross-sectional view of a package structure of a semiconductor device for explaining a fourth embodiment according to the present invention.

Embodiment 4:

FIG. 11 is a partially and enlarged cross-sectional view showing a fourth embodiment of a package structure of a semiconductor device of GTO according to the present invention.

In this fourth embodiment according to the present invention, the shape of the auxiliary cathode electrode 34 and the fixing method between the auxiliary cathode electrode 34 and the auxiliary cathode lead 24 are same those of the third embodiment according to the present invention.

However, different from the above third embodiment according to the present invention, the fixing to the cathode post using the screw member is not practiced. Further, by pressing under pressure in contact with the auxiliary cathode electrode 34 to the cathode buffer 32 are directed pressed under pressure through the insulating material member 344 such as teflon and mica etc., the system is practiced.

However, since the auxiliary cathode electrode 34 is separated from the cathode post 22 through the insulating material member 344, similarly to the third embodiment the current does not directly inflow into the cathode post 22 without through the cathode buffer 32, thereby the maximum turn-off current can be improved.

In this fourth embodiment according to the present invention, the various gate systems can be adopted.

Embodiment 5:

FIG. 12 is a cross-sectional view showing a fifth embodiment of a package structure of a semiconductor device of GTO according to the present invention.

This fifth embodiment according to the present invention differs from the center gate system shown in the first embodiment according to the present invention, in this fifth embodiment according to the present invention a periphery gate system is employed, namely the gate pressure contacting portion 33 is provided at the periphery portion of the GTO pellet 10 with a ring form.

In this case, the draw-out of the gate current becomes most difficult at the central portion of the GTO pellet 10. So as to attain the main object of the present invention, it is necessary to arrange the auxiliary cathode lead 24 so as to flow the auxiliary cathode current into the unit GTO which is arranged at a vicinity of the central portion of the GTO pellet 10.

As a result, in this fifth embodiment according to the present invention, the auxiliary cathode electrode 34, which is fixed and connected to the auxiliary cathode lead 24, is arranged at the central portion of the GTO pellet 10 and pressed under pressure and the auxiliary cathode electrode 34 is contacted to the cathode buffer 34.

Consequently, by the gate wiring resistance 13 in the surface of the GTO pellet 10, even the draw-out of the gate current is arranged at the unit GTO of the vicinity of the central portion of the GTO pellet 10 and is insufficient.

By the push-into effect of the cathode current, the negative cathode current state during the turn-off can be realized, and the fall-down of the anode current can be performed sufficiently.

Accordingly, similarly to the explanation in the first embodiment according to the present invention, without the destroy of the element it can reach the "off" state.

In this fifth embodiment according to the present invention, so as to determine the position of the auxiliary cathode electrode 34, a shallow dent portion is provided on the cathode buffer 32 and the auxiliary cathode electrode 34 is arranged and received in the shallow dent portion.

This is an example for determining the position of the auxiliary cathode electrode 34. The present invention is not limited to this method but can employ other methods, for example, it can employ a method in which the cathode buffer 32 is made flat. It will be clear that the similar effect can be obtained.

However, it is desirable that the auxiliary cathode electrode 34 is accurately arranged at the central portion of the GTO pellet 10 as possible as.

Further, it is natural from the object of the present invention that, so as not directly contact the cathode post 22 and the auxiliary cathode electrode 34, the auxiliary cathode electrode 34 is covered by the insulating material member such as teflon.

Further, by the similar reasons, it is necessary to cover the auxiliary cathode lead 24 without the direct contact to the cathode post 22.

Figure 14:
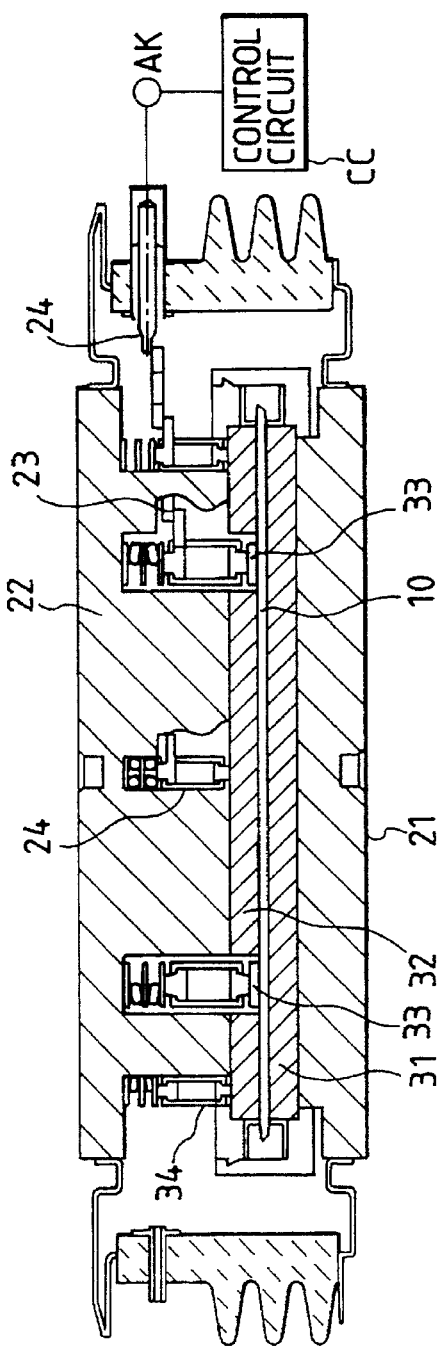
FIG. 14 is a longitudinal cross-sectional view of a package structure of a semiconductor device of a sixth embodiment according to the present invention.

Embodiment 6:

FIG. 14 is a cross-sectional view showing a sixth embodiment of a package structure of a semiconductor device of GTO according to the present invention.

In this sixth embodiment according to the present invention, an intermediate gate system is employed, namely the gate pressure contacting portion 33 is provided on the GTO pellet 10 with a ring form. So as to contact the gate pressure contacting portion 33 to the GTO pellet 10, a clearance having a ring form is provided on the cathode buffer 32.

In this case, the draw-out of the gate current becomes most difficult at the central portion of the GTO pellet 10 and the peripheral portion of the GTO pellet 10.

So as to attain the main object of the present invention, it is necessary to arrange the auxiliary cathode lead 24 so as to flow the auxiliary cathode current into the unit GTO which is arranged at a vicinity of the central portion of the GTO pellet 10 and the unit which is arranged at a vicinity of the peripheral portion of the GTO pellet 10.

As a result, in this sixth embodiment according to the present invention, the auxiliary cathode electrode 34, which is fixed and connected to the auxiliary cathode lead 24, is arranged at the central portion of the GTO pellet 10 and is contacted to the central portion of the auxiliary cathode buffer 33 positioned in the inside.

Further, the auxiliary cathode electrode 34 is arranged and contacted to the peripheral portion of the ring form cathode buffer 32 and thereby the auxiliary cathode electrode 34 is pressed under pressure in contact with the cathode buffer 34.

Consequently, by the gate wiring resistance 13 in the surface of the GTO pellet 10, even the draw-out of the gate current is arranged at the unit GTO of the vicinity of the central portion of the GTO pellet 10 and the unit GTO of the vicinity of the peripheral portion of the GTO pellet 10 and is insufficient.

By the push-into effect of the auxiliary cathode current, the negative cathode current state during the turn-off can be realized, and the fall-down of the anode current can be performed sufficiently.

Accordingly, similarly to the explanation in the first embodiment according to the present invention, without the destroy of the unit GTO it can reach the "off" state.

Further, by the similar reasons in the above fifth embodiment according to the present invention, it is necessary to cover the auxiliary cathode lead 24 without the direct contact to the cathode post 22.

Figure 15:
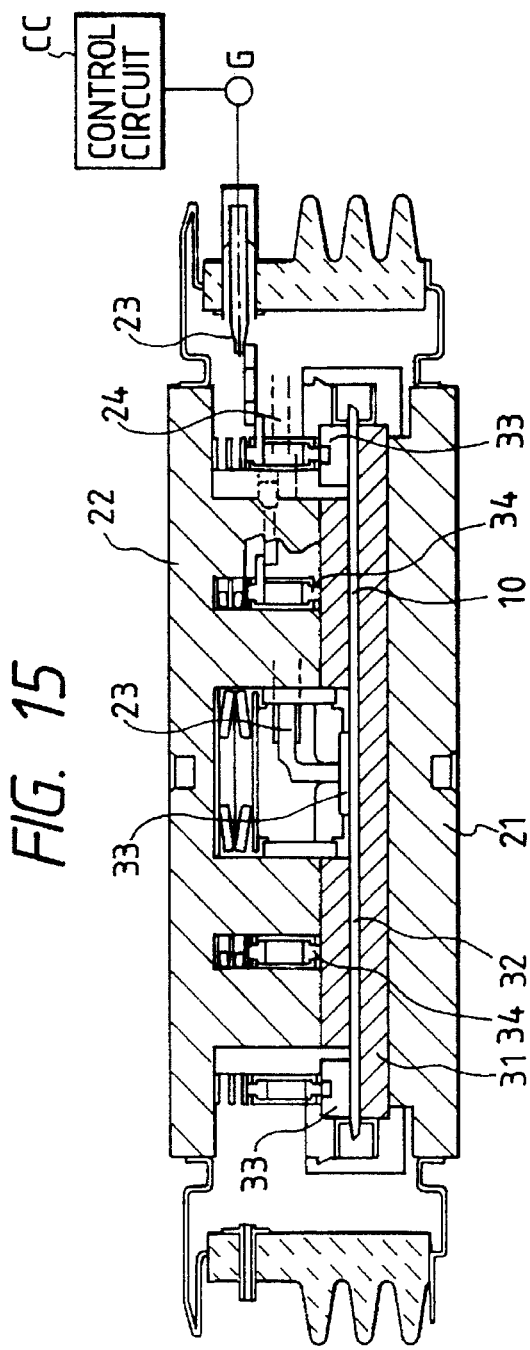
FIG. 15 is a longitudinal cross-sectional view of a package structure of a semiconductor device of a seventh embodiment according to the present invention.
Figure 16:
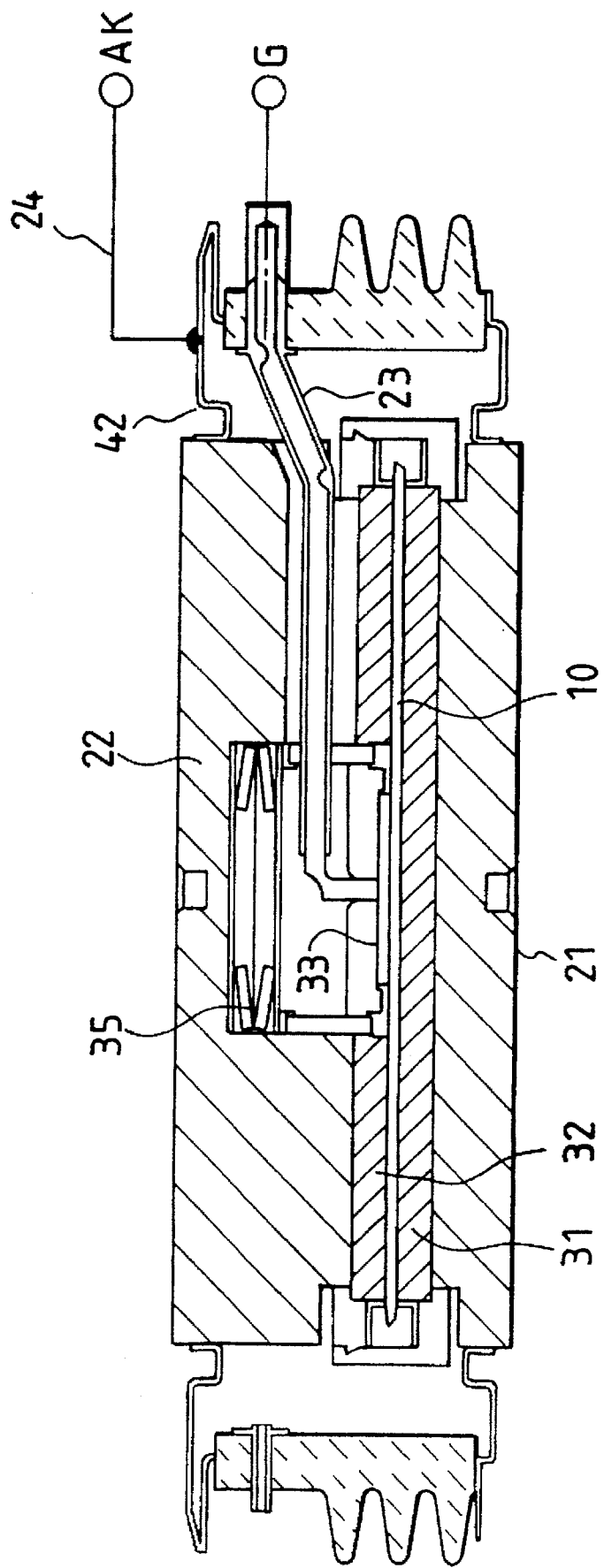
FIG. 16 is a longitudinal cross-sectional view of a package structure of a semiconductor device according to the prior art.
Figure 18:
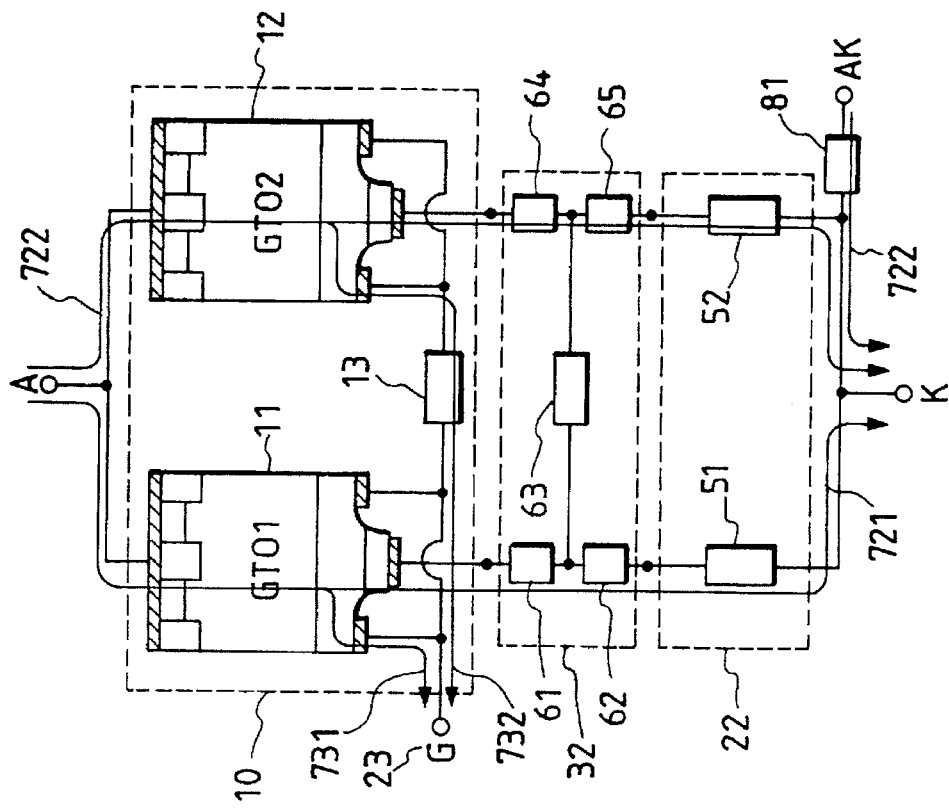
FIG. 18 is an operation explanation view of the package structure of the semiconductor device according to the prior art.
Figure 17:
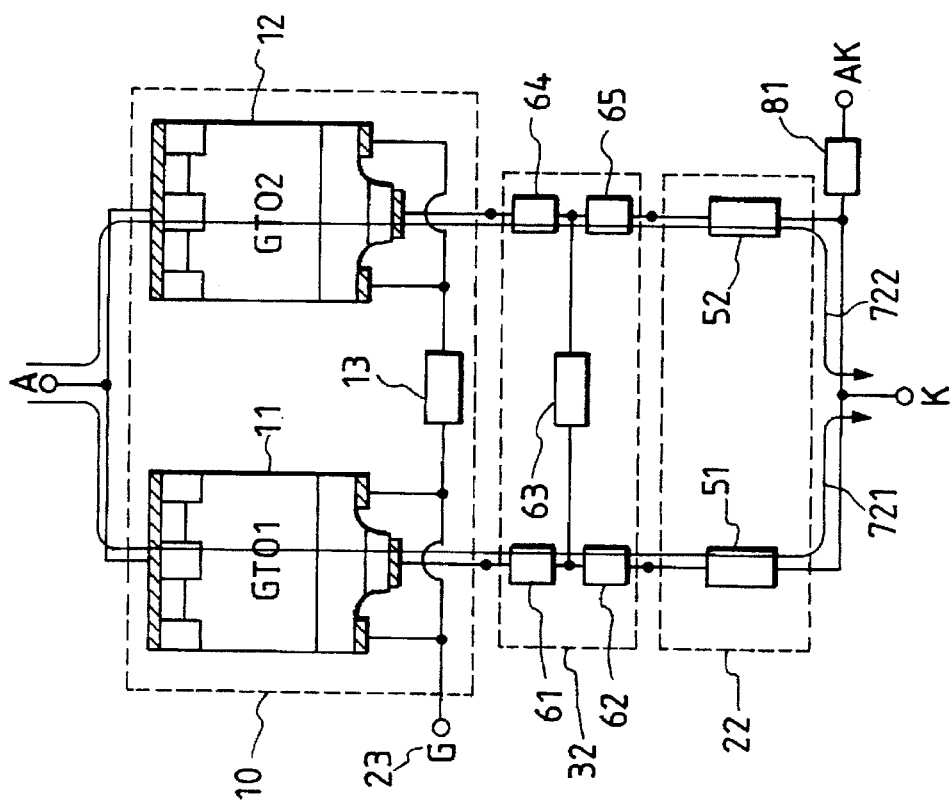
FIG. 17 is an operation explanation view of the package structure of the semiconductor device according to the prior art.
Figure 19:
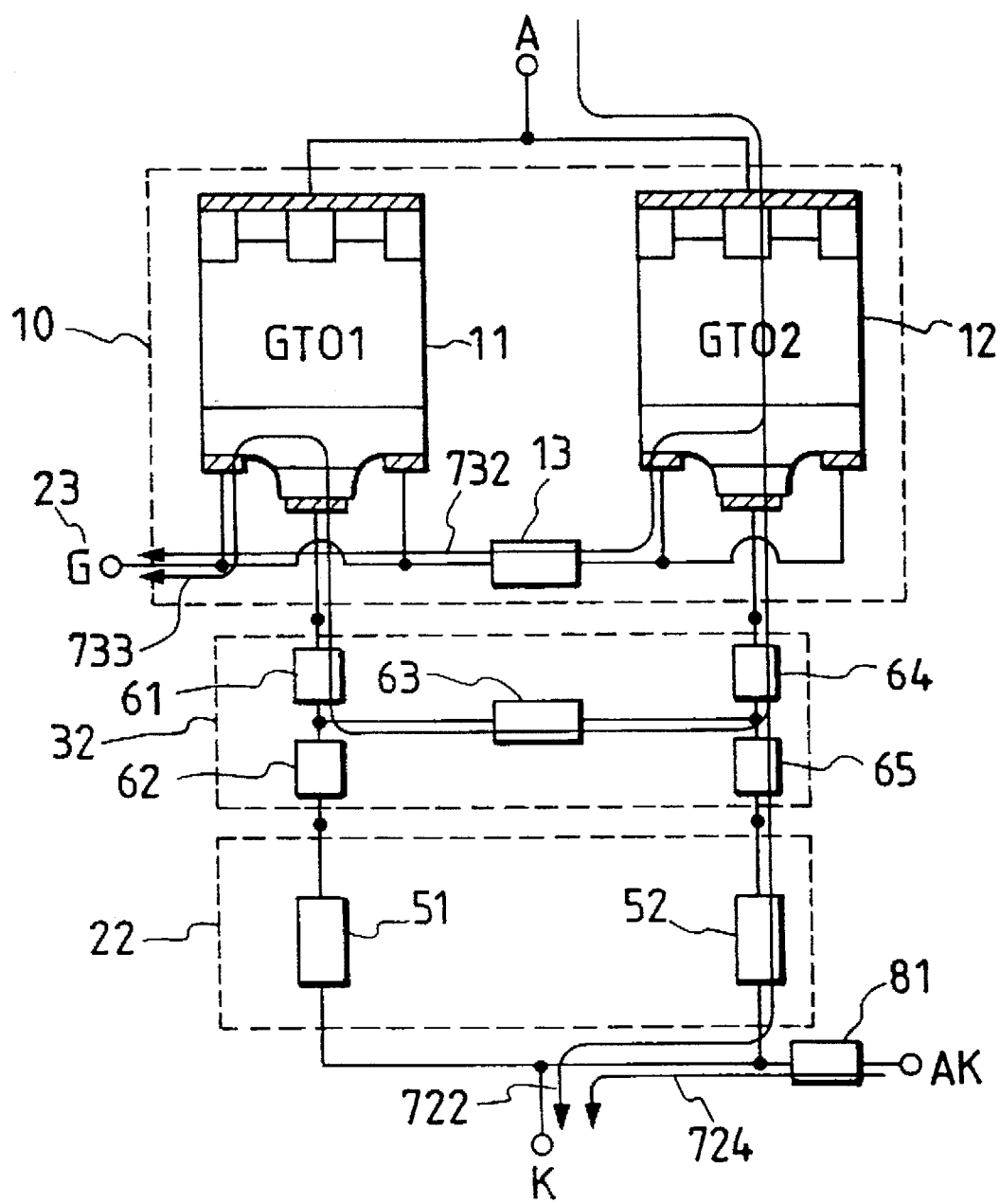
FIG. 19 is an operation explanation view of the package structure of the semiconductor device according to the prior art.
Figure 20:
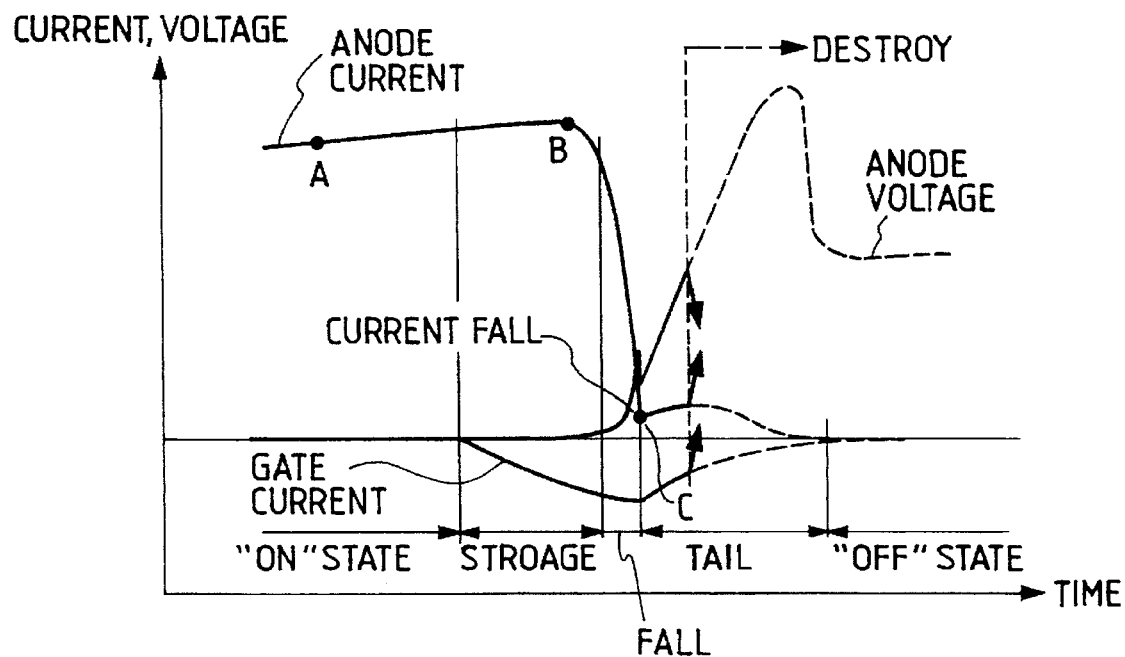
FIG. 20 is a turn-off wave-form view of a package structure of a semiconductor device of GTO for explaining the prior art.

Embodiment 7:

FIG. 15 is a cross-sectional view showing a package structure of a semiconductor device of GTO of a seventh embodiment according to the present invention.

This seventh embodiment according to the present invention is an example of a complex gate system package structure in which the gate pressure contacting portions 33 are provided on the central portion of the GTO pellet 10 and on the ring form periphery portion of the GTO pellet 10.

In this case, the draw-out of the gate current is most difficult at an intermediate portion between the gate pressure contacting portion 33 which is existed at the central portion of the GTO pellet 10 and the gate pressure contacting portion 33 which is existed at the peripheral portion of the GTO pellet 10.

To put in concrete, the draw-out of the gate current is determined by the unit pattern arrangement on the surface of the GTO pellet 10, it is not limited to have an equal distance from the gate pressure contacting portion 33 of the GTO pellet 10 which is existed at the central portion of the GTO pellet 10 and the gate pressure contacting portion 33 which is existed at the peripheral portion of the GTO pellet 10.

However, from both gate pressure contacting portions 33 it exists necessarily the intermediate region in which the draw-out of the gate current becomes difficult. Thereby, it is necessary to arrange the auxiliary cathode current so as to inflow the auxiliary cathode current into the unit GTO which is arranged at the intermediate portion between the central portion of the GTO pellet 10 and the periphery portion of the GTO pellet 10.

For this reasons, in the seventh embodiment according to the present invention, the auxiliary cathode electrode 34, which is fixed and connected to the auxiliary cathode lead 24, is arranged between the intermediate portion between the central portion of the GTO pellet 10 and the periphery portion of the GTO pellet 10. Further, the auxiliary cathode electrode 34 is pressed under pressure in contact with the cathode buffer 32.

Consequently, by the gate wiring resistance on the surface of the GTO pellet 10, even the draw-out of the gate current is arranged at the unit GTO of the intermediate portion of the central portion of the pellet and the peripheral portion of the GTO pellet 10 and is insufficient.

By the push-into effect of the auxiliary cathode current, the negative cathode current state during the turn-off can be realized, and the fall-down of the anode current can be performed sufficiently.

Accordingly, similarly to the explanation in the first embodiment according to the present invention, without the destroy of the unit GTO it can reach the "off" state.

Since each of the above stated embodiments according to the present invention shows the pressurization type semiconductor device, there have the merits in which the heat generated in the semiconductor device can be discharged and further the electrode and the semiconductor pellet can be certainly contacted, thereby the high reliability can be attained.

In the above the example of GTO performed the present invention is exemplified. However, the present invention is not to limit GTO but also can adopt to a semiconductor device in which the current is drawn out for the control electrode during the turn-off, for example, an electrostatic induction thyrister and a bipolar transistor etc..

Further, in the semiconductor device adopted to the present invention, since the maximum turn-off current is improved by the package structure, the unbalance of the "on" current in the interior portion of the unit GTO during the "on" state and the increase of the "on" voltage do not occur.

Embodiment 8:

Hereinafter, one example of a power inverter having the semiconductor device of GTO adopted to the present invention will be explained.

Figure 21:
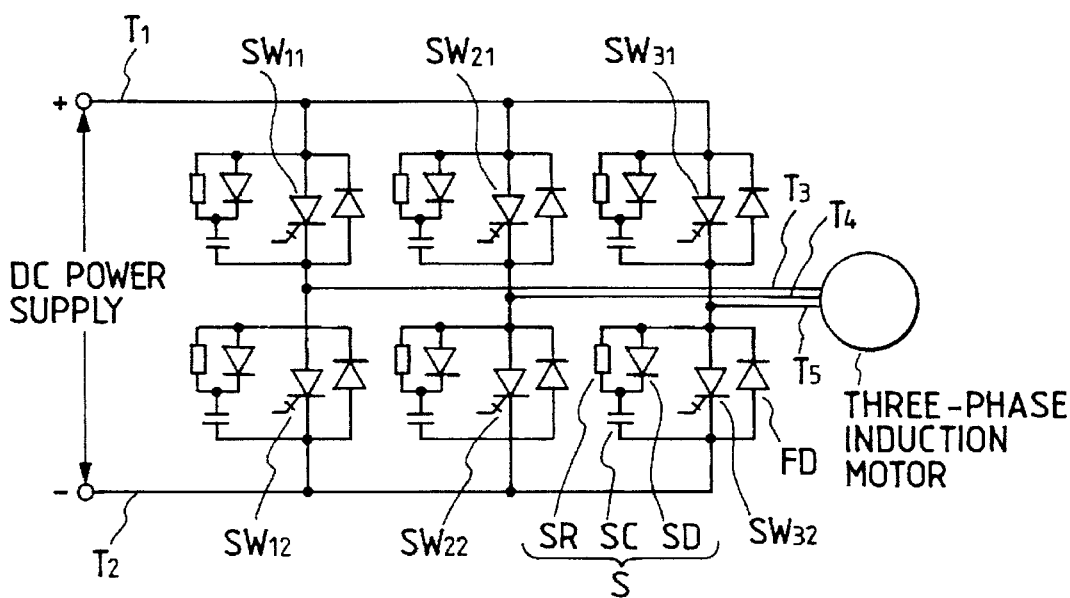
FIG. 21 shows one embodiment of a power inverter having a package structure of a semiconductor device of GTO according to the present invention.

FIG. 21 shows one embodiment of a power inverter using for a motor driving circuit which is constituted by using GTO ($SW_{11}$, $SW_{12}$, $SW_{21}$, $SW_{22}$, $SW_{31}$, $SW_{32}$) of the first embodiment according to the present invention.

Two GTO (for example, $SW_{11}$ and $SW_{12}$) are connected in series and constitutes an inverter unit having one phase. Further, in each of GTO, a fly-wheel diode FD is reversely connected in parallel.

Further, in each of GTO, so as to protect GTO from the abrupt voltage rise, the so-called snubber circuit S is connected in parallel. In the snubber circuit S, a condenser SC is connected to the diode SD and the resistance SR in series.

A series connection point of two GTO in each phase is connected to alternative terminals $T_3$, $T_4$ and respectively. A three-phase induction motor is connected to each of the alternative terminals.

Three anodes of GTO at an upper arm side are in common and are connected to the high potential side of the direct voltage power source at the direct terminal $T_1$. Three cathodes of GTO at a lower arm side are in common and is connected to the low potential side of a direct voltage power source at the direct terminal $T_2$.

With the power inverter having the above stated constitution, by the switching operation of each of the plural GTO, the direct current is converted to the alternative current and the three-phase induction motor is driven. Between the gate and the cathode of each of the plural GTO at the upper and lower arm sides, a gate circuit is provided and this gate circuit controls the switching operation.

According to the above embodiment of the power inverter according to the present invention, since the high maximum turn-off current in GTO can be obtained, the power inverter having the large current can be obtained.

Further, according to the high maximum turn-off current in GTO, since the condenser capacity in the snubber circuit can be performed small, the power loss in snubber circuit can be lessened. As a result, the small scale power inverter can be obtained and the efficiency in the power inverter can be improved.

In this power inverter, GTO shown in the first embodiment according to the present invention can be used and also GTO shown in other embodiments according to the present invention can be used and in this case and then the similar effect can be obtained.

As stated in detail in the above, according to the present invention, since the auxiliary cathode lead is contacted to the cathode buffer electrode, without inviting the increase in the "on" voltage the maximum turn-off current can be heightened.

As a result, the large current in the unit GTO according to the increase of the diameter of the GTO pellet can be easily obtained. Further, since the maximum turn-off current is heightened, the condenser provided on the snubber circuit being the protection circuit of the unit GTO can be performed small, the effect in which the loss in the snubber circuit can be lessened can be obtained.

We claim:

1. A semiconductor device comprises:

a semiconductor pellet on which a first main electrode, a second main electrode, and a control electrode for controlling current flow between said first main electrode and said second main electrode are formed;

a first electrode plate contacted to said first main electrode of said semiconductor pellet;

a second electrode plate contacted to said second main electrode of said semiconductor pellet;

a first outside electrode pressed under pressure in contact with said first electrode plate;

a second outside electrode pressed under pressure in contact with said second electrode plate; and a control electrode lead contacted to said control electrode of said semiconductor pellet;

wherein the semiconductor deice comprises further:

an auxiliary electrode lead contacted to said first electrode plate, wherein said first outside electrode is not directly contacted to said auxiliary electrode lead.

2. A semiconductor device comprises:

a semiconductor pellet on which a first main electrode, a second main electrode, and a control electrode for controlling current flow between said first main electrode and said second main electrode are formed;

a first electrode plate contacted to said first main electrode of said semiconductor pellet;

a second electrode plate contacted to said second main electrode of said semiconductor pellet;

a first outside electrode pressed under pressure in contact with said first electrode plate;

a second outside electrode pressed under pressure in contact with said second electrode plate; and a control electrode lead contacted to said control electrode of said semiconductor pellet;

wherein the semiconductor device comprises further:

an auxiliary electrode lead contacted to said first electrode plate, wherein said first outside electrode is not directly contacted to said auxiliary electrode lead; and a contact portion between said first electrode plate and said auxiliary electrode lead being adjacent to said first electrode plate at a region which is most remote from a contact portion between said control electrode lead and said control electrode of said semiconductor pellet.

3. A semiconductor device according to claim 1 or claim 2, wherein each of said control electrode lead and said auxiliary electrode lead is respectively connected to a control circuit.

4. A semiconductor device according to any one of from claim 1 or claim 2, wherein a contact portion between said control electrode lead and said control electrode of said semiconductor pellet exists on a central portion of said semiconductor pellet; and wherein a contact portion between said electrode plate and said auxiliary electrode lead exists on a peripheral portion of said semiconductor pellet.

5. A semiconductor device according to claim 1 or claim 2, wherein a contact portion between said control electrode lead and said control electrode of said semiconductor pellet exists on a peripheral portion of said semiconductor pellet; and wherein a contact portion between said electrode plate and said auxiliary electrode lead exists on a central portion of said semiconductor pellet.

6. A semiconductor device according to claim 1 or claim 2, wherein a contact portion between said control electrode lead and said control electrode of said semiconductor pellet exists on a portion between a central portion and a peripheral portion of said semiconductor pellet; and wherein a contact portion between said electrode plate and said auxiliary electrode lead exists on a portion between said central portion and said peripheral portion of said semiconductor pellet.

7. A semiconductor device according to claim 1 or claim 2, wherein a contact portion between said control electrode lead and said control electrode of said semiconductor pellet exists on a central portion and a peripheral portion of said semiconductor pellet; and wherein a contact portion between said electrode plate and said auxiliary electrode lead exists on a portion between said central portion and said peripheral portion of said semiconductor pellet.

8. A semiconductor device according to claim 1 or claim 2, wherein said electrode plate and said auxiliary electrode lead are pressed under pressure in contact with each other.

9. A semiconductor device according to claim 1 or claim 2, the semiconductor device characterized in that said auxiliary electrode lead is fixed to said outside electrode through an insulation material member; and said outside electrode is pressed under pressure in contact with said electrode plate.

10. A semiconductor device according to claim 3, wherein a contact portion between said control electrode lead and said control electrode of said semiconductor pellet exists on a central portion of said semiconductor pellet; and wherein a contact portion between said electrode plate and said auxiliary electrode lead exists on a peripheral portion of said semiconductor pellet.

11. A semiconductor device according to claim 3, wherein a contact portion between said control electrode lead and said control electrode of said semiconductor pellet exists on a peripheral portion of said semiconductor pellet; and wherein a contact portion between said electrode plate and said auxiliary electrode lead exists on a central portion of said semiconductor pellet.

12. A semiconductor device according to claim 3, wherein a contact portion between said control electrode lead and said control electrode of said semiconductor pellet exists on a portion between a central portion and a peripheral portion of said semiconductor pellet; and wherein a contact portion between said electrode plate and said auxiliary electrode lead exists on a portion between said central portion and said peripheral portion of said semiconductor pellet.

13. A semiconductor device according to claim 3, wherein a contact portion between said control electrode lead and said control electrode of said semiconductor pellet exists on a central portion and a peripheral portion of said semiconductor pellet; and wherein a contact portion between said electrode plate and said auxiliary electrode lead exists on a portion between said central portion and said peripheral portion of said semiconductor pellet.

14. A semiconductor device according to claim 3, wherein said electrode plate and said auxiliary electrode lead are pressed under pressure in contact with each other.

15. A semiconductor device according to claim 4, wherein said electrode plate and said auxiliary electrode lead are pressed under pressure in contact with each other.

16. A semiconductor device according to claim 5, wherein said electrode plate and said auxiliary electrode lead are pressed under pressure in contact with each other.

17. A semiconductor device according to claim 6, wherein said electrode plate and said auxiliary electrode lead are pressed under pressure in contact with each other.

18. A semiconductor device according to claim 7, wherein said electrode plate and said auxiliary electrode lead are pressed under pressure in contact with each other.

19. A semiconductor device according to claim 3, wherein said auxiliary electrode lead is fixed to said outside electrode through an insulation material member; and said outside electrode is pressed under pressure in contact with said electrode plate.

20. A semiconductor device according to claim 4, wherein said auxiliary electrode lead is fixed to said outside electrode through an insulation material member; and said outside electrode is pressed under pressure in contact with said electrode plate.

21. A semiconductor device according to claim 5, wherein said auxiliary electrode lead is fixed to said outside electrode through an insulation material member; and said outside electrode is pressed under pressure in contact with said electrode plate.

22. A semiconductor device according to claim 6, wherein said auxiliary electrode lead is fixed to said outside electrode through an insulation material member; and said outside electrode is pressed under pressure in contact with said electrode plate.

23. A semiconductor device according to claim 7, wherein said auxiliary electrode lead is fixed to said outside electrode through an insulation material member; and said outside electrode is pressed under pressure in contact with said electrode plate.

24. A package structure of a semiconductor device comprises:

a semiconductor pellet on which a first main electrode, a second main electrode, and a control electrode for controlling current flow between said first main electrode and said second main electrode are formed a first electrode plate contacted to said first main electrode of said semiconductor pellet;

a second electrode plate contacted to said second main electrode of said semiconductor pellet;

a first outside electrode pressed under pressure in contact with said first electrode plate;

a second outside electrode pressed under pressure in contact with said second electrode plate; and a common electrode lead contacted to said control electrode of said semiconductor pellet;

wherein the package structure of the semiconductor device comprises further:

an auxiliary electrode lead contacted to said first electrode plate, wherein said first outside electrode is not directly contacted to said auxiliary electrode lead.

25. A package structure of a semiconductor device comprises:

a semiconductor pellet on which a first main electrode, a second main electrode, and a control electrode for controlling current flow between said first main electrode and said second main electrode are formed;

a first electrode plate contacted to said first main electrode of said semiconductor pellet;

a second electrode plate contacted to said second main electrode of said semiconductor pellet;

a first outside electrode pressed under pressure in contact with said first electrode plate;

a second outside electrode pressed under pressure in contact with said second electrode plate; and a control electrode lead contacted to said control electrode of said semiconductor pellet;

wherein the package structure of the semiconductor device comprises further:

an auxiliary electrode lead contacted to said first electrode plate wherein said first outside electrode is not directly contacted to said auxiliary electrode lead; and wherein a contact portion between said first electrode plate and said auxiliary electrode lead is adjacent to said electrode plate at a region most remote from a contact portion between said control electrode lead and said control electrode of said semiconductor pellet.

26. A package structure of a semiconductor device according to claim 24 or claim 25, wherein each of said control electrode lead and said auxiliary electrode lead is respectively connected to a control circuit.

27. A package structure of a semiconductor device according to from claim 24 or claim 26, wherein a contact portion between said control electrode lead and said control electrode of said semiconductor pellet exists on a central portion of said electrode plate; and wherein a contact portion between said electrode plate and said auxiliary electrode lead exists on a peripheral portion of said electrode plate.

28. A package structure of a semiconductor device according to claim 24 or claim 26, wherein a contact portion between said control electrode lead and said control electrode of said semiconductor pellet exists on a peripheral portion of said electrode plate; and wherein a contact portion between said electrode plate and said auxiliary electrode lead exists on a central portion of electrode plate.

29. A package structure of a semiconductor device according to claim 24 or claim 26, wherein a contact portion between said control electrode lead and said control electrode of said semiconductor pellet exists on a portion between a central portion and a peripheral portion of said electrode plate; and wherein a contact portion between said electrode plate and said auxiliary electrode lead exists on said central portion and said peripheral portion of said electrode plate.

30. A package structure of a semiconductor device according to claim 24 or claim 26, wherein a contact portion between said control electrode lead and said control electrode of said semiconductor pellet exists on a central portion and a peripheral portion of said electrode plate; and wherein a contact portion between said electrode plate and said auxiliary electrode lead exists on a portion between said central portion and said peripheral portion of said electrode plate.

31. A package structure of a semiconductor device according to claim 24 or claim 30, wherein said electrode plate and said auxiliary electrode lead are pressed under pressure in contact with each other.

32. A package structure of a semiconductor device according to claim 24 or claim 30, wherein said auxiliary electrode lead is fixed to said outside electrode through an insulation material member; and wherein said outside electrode is pressed under pressure in contact with said electrode plate.

33. A semiconductor device according to claim 26, wherein a contact portion between said control electrode lead and said control electrode of said semiconductor pellet exists on a central portion of said electrode plate; and wherein a contact portion between said electrode plate and said auxiliary electrode lead exists on a peripheral portion of said electrode plate.

34. A semiconductor device according to claim 26, wherein a contact portion between said control electrode lead and said control electrode of said semiconductor pellet exists on a peripheral portion of said electrode plate; and wherein a contact portion between said electrode plate and said auxiliary electrode lead exists on a central portion of said electrode plate.

35. A semiconductor device according to claim 26, wherein a contact portion between said control electrode lead and said control electrode of said semiconductor pellet exists on a portion between said a central portion and a peripheral portion of said electrode plate; and wherein a contact portion between said electrode plate and said auxiliary electrode lead exists on said central portion and said peripheral portion of said electrode plate.

36. A semiconductor device according to claim 26, wherein a contact portion between said control electrode lead and said control electrode of said semiconductor pellet exists on a central portion and a peripheral portion of said electrode plate; and wherein a contact portion between said electrode plate and said auxiliary electrode lead exists on a portion between said central portion and said peripheral portion of said electrode plate.

37. A semiconductor device according to claim 26, wherein said electrode plate and said auxiliary electrode lead are pressed under pressure in contact with each other.

38. A semiconductor device according to claim 27, wherein said electrode plate and said auxiliary electrode lead are pressed under pressure in contact with each other.

39. A semiconductor device according to claim 28, wherein said electrode plate and said auxiliary electrode lead are pressed under pressure in contact with each other.

40. A semiconductor device according to claim 29, wherein said electrode plate and said auxiliary electrode lead are pressed under pressure in contact with each other.

41. A semiconductor device according to claim 30, wherein said electrode plate and said auxiliary electrode lead are pressed under pressure in contact with each other.

42. A semiconductor device according to claim 26, wherein said auxiliary electrode lead is fixed to said outside electrode through an insulation material member; and wherein said outside electrode is pressed under pressure in contact with said electrode plate.

43. A semiconductor device according to claim 27, wherein said auxiliary electrode lead is fixed to said outside electrode through an insulation material member; and wherein said outside electrode is pressed under pressure in contact with said electrode plate.

44. A semiconductor device according to claim 28, wherein said auxiliary electrode lead is fixed to said outside electrode through an insulation material member; and wherein said outside electrode is pressed under pressure in contact with said electrode plate.

45. A semiconductor device according to claim 29, wherein said auxiliary electrode lead is fixed to said outside electrode through an insulation material member; and wherein said outside electrode is pressed under pressure in contact with said electrode plate.

46. A semiconductor device according to claim 30, wherein said auxiliary electrode lead is fixed to said outside electrode through an insulation material member; and wherein said outside electrode is pressed under pressure in contact with said electrode plate.

* * * * *